United States Patent [19]

Yoshimasu

[11] Patent Number: 5,202,651
[45] Date of Patent: Apr. 13, 1993

[54] BAND-STOP FILTER CIRCUIT SUITABLY MADE INTO MONOLITHIC MICROWAVE INTEGRATED CIRCUITS

[75] Inventor: Toshihiko Yoshimasu, Souraku, Japan

[73] Assignee: Sharp Kabushiki Kaisha, Japan

[21] Appl. No.: 813,369

[22] Filed: Dec. 24, 1991

[30] Foreign Application Priority Data

Dec. 27, 1990 [JP] Japan .................................. 2-407476

[51] Int. Cl.⁵ ........................... H03H 7/07; H01P 1/20
[52] U.S. Cl. ...................................... 333/170; 333/176; 333/202
[58] Field of Search ............... 333/170, 171, 175, 176, 333/184, 204, 205, 246, 263, 202

[56] References Cited

U.S. PATENT DOCUMENTS

| | | | |
|---|---|---|---|
| 4,443,772 | 4/1984 | Schwarzmann | 333/170 X |
| 4,635,005 | 1/1987 | Kaminsky | 333/170 X |
| 4,885,562 | 12/1989 | Ouvrard et al. | 333/170 X |
| 5,065,117 | 11/1991 | Yoshimasu | 333/204 X |
| 5,095,285 | 3/1992 | Khatibzadeh | 333/184 X |

OTHER PUBLICATIONS

K. Honjo, et al., "X-Band Low-Noise GaAs Monolithic Frequency Converter" *IEEE Transactions on Microwave Theory and Techniques,* vol. MTT-33, No. 11 Nov. 1985, pp. 1231-1235.

*Primary Examiner*—Paul M. Dzierzynski
*Assistant Examiner*—Seung Ham
*Attorney, Agent, or Firm*—David G. Conlin; Robert F. O'Connell

[57] ABSTRACT

An image band-stop filter circuit includes a transmission line formed on a substrate of GaAs and a T circuit connected in parallel to the transmission line and having a high pass filter characteristic. The T circuit includes series-connected first and second capacitances connected in parallel to the transmission line and a stub having one end connected to a node between the first and second capacitances and the other end short-circuited. The stub has a line length which becomes inductive in an image signal band to be removed. As a result, the lengths of the transmission line and the stub can be reduced to enable the band-stop filter circuit to be made into a MMIC with ease while achieving an excellent signal transmission characteristic.

13 Claims, 5 Drawing Sheets

BAND-STOP FILTER CIRCUIT SUITABLY MADE INTO MONOLITHIC MICROWAVE INTEGRATED CIRCUITS

BACKGROUND OF THE INVENTION

1. Field of the Invention

The present invention relates generally to band-stop filter circuits, and more particularly, to an improvement of a band-stop filter circuit for use in processing a signal of a high frequency band such as a SHF (Super High Frequency) band.

2. Description of the Background Art

In general, a receiver for direct satellite broadcasting using a signal of a SHF band frequency comprises an antenna for receiving a signal of 12 GHz band transmitted from a broadcasting satellite to ground, a BS converter for amplifying a received radio wave and converting the signal into an intermediate frequency signal, and a BS tuner for performing such processings as a demodulation of the intermediate frequency signal supplied from the BS converter.

FIG. 1 is a schematic block diagram showing the structure of a BS converter in such a conventional satellite broadcasting receiving apparatus. With reference to FIG. 1, a signal of a SHF band (12 GHz band) received by an antenna 60 is amplified by a high frequency low noise amplifier 61 and thereafter is applied to an image band-stop filter circuit 62 structured by a band pass filter (BPF) and the like. The image band-stop filter circuit 62 prevents a signal of an image frequency band, out of the applied signal, from passing.

The signal having passed through the image band-stop filter circuit 62 is mixed by a mixer 63 with a local oscillation signal of 10.7 GHz supplied from a local oscillator 64 and converted into an intermediate frequency signal of 1 GHz band. The intermediate frequency signal is amplified by an intermediate frequency amplifier 65 and is supplied to a BS tuner (not shown) through an output terminal 66.

FIG. 2 is a circuit diagram showing the image band-stop filter circuit 62 shown in FIG. 1. This filter circuit 62 is provided for the following reason. If an image signal is inputted to the mixer 63 and difference between the image signal frequency $f_3$ and the above mentioned local oscillation frequency $f_2$ is equal to that between the frequency $f_1$ of the desired signal to be received and the local oscillation frequency $f_2$ as shown in a spectrum diagram of FIG. 3, the desired signal and the inputted image signal are converted into signals of the same frequency band (1 GHz). After both signals are thus converted, they can not be separated from each other any more. Accordingly, it is required to remove such image signal in advance before it is inputted to the mixer 63.

The circuit 62 is formed by microstrip lines, comprising main lines 71 and 72, an input port 73, an output port 74 and a parallel stub 70 having one end connected to the node between the main lines 71 and 72 and a termination being opened. The parallel stub 70 is designed to have an electrical length $\theta 70$ to become one-fourth of a wavelength of a center frequency $fr$ of an image band to be removed at the center frequency $fr$.

A signal pass band $f_1$ of satellite broadcasting using a SHF band covering Japan and the United States is about 11.7 GHz to 12.2 GHz and a local oscillator frequency $f_2$ is about 10.7 GHz. The center frequency $fr$ of the image band $f_3$ to be removed by the filter circuit of FIG. 2 is therefore about 9.4 GHz. More specifically, referring to FIG. 3, the image frequency $f_3$ is obtained as follows:

$$f_3 = f_2 - (f_1 - f_2)$$
$$= 2f_2 - f_1$$
$$= 9.2 \sim 9.7 \text{GHz}$$

Accordingly, the center frequency $fr$ thereof becomes about 9.4 GHz. In this case, the filter circuit of FIG. 2 formed on a GaAs substrate requires line length of about 2.8 mm for the parallel stub 70.

Such a circuit as shown in FIG. 1 has been conventionally formed as a MIC (Microwave Integrated Circuit) structured by connecting such circuit devices as transistors and diodes disposed on a dielectric substrate by microstrip lines.

In recent years, however, such devices as field effect transistors (FET) have been developed which use GaAs or InP material having a mobility of electrons five or six times larger than that of Si, and various attempts have been made to make such devices and various circuits such as a matching circuit and a bias circuit monolithic. The monolithic MIC is referred to as a MMIC (Monolithic Microwave IC) which is more compact and having more excellent reliability than the conventional MIC. Thus, MMIC is applied to such a circuit for receiving satellite broadcasting of a SHF band as shown in FIG. 1. A frequency converter structured as a MMIC is disclosed, for example, in "X-Band Low-Noise GaAs Monolithic Frequency Converter", by K. Honjo et al. in IEEE Transactions on Microwave Theory and Techniques Vol. MTT-33, No. 11, November 1985 pp.1231-1235 and U.S. Ser. No. 533,576, filed Jun. 5, 1990 (U.S. Pat. No. 5,065,117) by the same assignee of the present invention.

Since in a MMIC, a distributed constant circuit is formed on a semiconductor substrate of GaAs or the like, it is very difficult to form such a long line in the order of millimeter as the above-described parallel stub 70 in terms of a chip size. It is therefore difficult to form the image band-stop filter circuit shown in FIG. 2 as a MMIC.

The broken line of the graph of FIG. 4 shows a calculation result of a signal transmission characteristic (frequency characteristic) of such a filter circuit as shown in FIG. 2 formed on a GaAs substrate with a parallel stub set to have a line length of 2.8 mm as described above and the respective characteristic admittances Y70, Y71, Y72 of the parallel stub 70 and the main lines 71 and 72 set to be 0.02 mho. In FIG. 4, the abscissa shows a signal frequency (GHz) and the ordinate shows a ratio of output/input of the filter circuit or transmission loss $|S_{21}|^2$ (dB). The calculation result shown in FIG. 4 is obtained on the assumption that the input and output ports 73 and 74 are the terminals terminating at 50Ω.

As is clear from the calculation result of FIG. 4, the filter circuit structured on the above-described conditions does not necessarily obtain a desired filter characteristic because a signal attenuation amount of a band to be removed (9.2 GHz–9.7 GHz) is relatively as small as about −20 dB, while a transmission loss in a signal pass band (11.7 GHz–12.2 GHz) is relatively as large as about 4 dB.

As described in the foregoing, forming the filter circuit shown in FIG. 2 as a MMIC on a GaAs substrate requires a reduction of a circuit area while obtaining an excellent characteristic as a band-stop filter.

Designing a filter circuit generally involves the following problems:

(1) A filter circuit implemented as a distributed constant circuit leads to an increase in the size of the circuit itself.

(2) A filter circuit implemented as a concentrated constant circuit limits an allowable inductance value due to the effect of a self-resonant frequency of a spiral inductor.

These problems make it difficult to obtain a filter circuit occupying reduced area and suitably made into a MMIC, and having a desired filter characteristic.

SUMMARY OF THE INVENTION

An object of the present invention is to provide a band-stop filter circuit suitably made into a MMIC.

Another object of the present invention is to provide a band-stop filter circuit having a desired signal transmission characteristic.

A further object of the present invention is to provide a band-stop filter circuit wherein transmission lines of a distributed constant circuit on a semiconductor substrate are shortened.

Still further object of the present invention is to provide a band-stop filter circuit having an increased signal attenuation in a signal stop-band and a reduced transmission loss in a signal pass band.

Briefly stated, the band-stop filter circuit according to the present invention includes input and output terminals, a transmission line connecting the input and the output terminals and a T circuit connected in parallel to the transmission line. The T circuit includes series-connected first and second capacitances connected in parallel to the transmission line and a stub having one end connected to the node between the first and the second capacitances and the other end short-circuited. The stub has a length being rendered inductive in a signal band to be removed.

According to another aspect of the present invention, the characteristic impedance of the stub is larger than the characteristic impedance of the transmission line.

According to a further aspect of the present invention, the T circuit further includes second and third transmission lines cascade-connected to the first and the second capacitances.

Therefore, the present invention has a main advantage in making a band-stop filter circuit smaller in scale and into a MMIC by connecting a T circuit having a high pass filter characteristic in parallel with the transmission line.

The present invention has another advantage in obtaining an increased signal attenuation in a signal stop-band and a reduced transmission loss in a signal pass band by connecting a T circuit having a high pass filter characteristic in parallel with a transmission line.

The present invention has a further advantage in making a band-stop filter circuit smaller in scale by setting a characteristic impedance of a stub to be larger than a characteristic impedance of a transmission line.

The present invention has still further advantage in further reducing a transmission loss in a signal pass band by cascade-connecting second and third transmission lines to first and second capacitances constituting a T circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
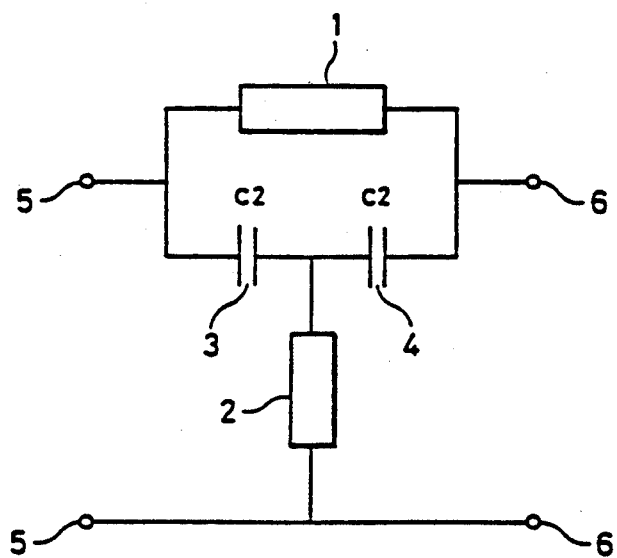
FIG. 5 is a circuit diagram showing an image band-stop filter circuit according to a first embodiment of the present invention.

FIG. 5 is a circuit diagram showing an image band-stop filter circuit according to a first embodiment of the present invention. The circuit comprises a transmission line 1, series-connected capacitances 3 and 4 provided in parallel with the transmission line 1, a parallel short stub 2 having one end connected to the node between the capacitances 3 and 4 and a tip short-circuited, an input port 5 and an output port 6.

In the circuit of FIG. 5, the short stub 2 has a line length set to become inductive in a signal stop-band (9.2 GHz–9.7 GHz) In other words, the T circuit including the short stub 2 and the capacitances 3 and 4 has a characteristic as a high pass filter.

Connecting the T circuit having a high pass filter characteristic in parallel with the transmission line 1 enables an excellent filter characteristic (a large signal attenuation in a stop-band and a small transmission loss in a pass-band) to be obtained with a small line length, thereby allowing a filter circuit to be made into a MMIC as will be described in detail later.

The following is a detailed description of an operation principle in implementing the first embodiment of FIG. 5 as a MMIC on a GaAs substrate. In FIG. 5, Y parameters of the MMIC filter circuit shown in FIG. 5 will be expressed by the following equations on the assumption that C1 and C2 respectively represent the capacitance values of the capacitances 3 and 4, Z2 and L2 respectively represent a characteristic impedance and a line length of the short stub and Z1 and L1 respectively represent a characteristic impedance and a line length of the transmission line 1.

$$Y_{11} = \frac{j\omega C1 \times (1 - \omega C2 Z2 \tan\theta 2)}{1 - \omega(C1 + C2)Z2\tan\theta 2} - \frac{j}{Z1\tan\theta 1} \quad (1)$$

-continued $$Y_{21} = \frac{j\omega^2 C1C2\tan\theta 2}{1 - \omega(C1 + C2)Z2\tan\theta 2} + \frac{j}{Z1\sin\theta 1} \quad (2)$$

$$Y_{22} = \frac{j\omega C2X(1 - \omega C1Z2\tan\theta 2)}{1 - \omega(C1 + C2)Z2\tan\theta 2} - \frac{j}{Z1\tan\theta 1} \quad (3)$$

$$\theta i = \omega \sqrt{\epsilon} \sqrt{\mu} Li \quad i = 1, 2 \text{ } (\theta i\text{: radiant}) \quad (4)$$

The signal stop frequency of the MMIC filter circuit can be obtained from $-Y21/Y22$ in case of open load. That is, from the above-described equations, $-Y21/Y22$ will be expressed as follows.

$$-\frac{Y21}{Y22} = \frac{1}{\cos\theta 1} \times \quad (5)$$

$$\frac{\omega^2 C1C2Z2\tan\theta 2 Z1\sin\theta 1 - \omega X(C1+C2)XZ2\tan\theta 2 + 1}{\omega^2 C1C2Z2\tan\theta 2 Z1\tan\theta 1 - \omega X(C2Z1\tan\theta 1 + (C1+C2)XZ2\tan\theta 2) + 1}$$

The signal stop frequency can be obtained from the numerator=0 of the above-described equation (5). That is, the signal stop frequency is as follows.

$$\text{(numerator)} = \omega^2 C1C2Z2\tan\theta 2 Z1\sin\theta 1 - \omega X(C1+C2)XZ2\tan\theta 2 + 1 = 0 \quad (6)$$

Herein, if both of $\theta 1$ and $\theta 2$ have values small $\sin=\tan\theta$ can approximately $\theta$, whereby equation (6) will be expressed as follows.

$$C1C2Z1Z2\epsilon\mu L1L2\omega^4 - \quad (8)$$

$$(C1 + C2) \times Z2 \sqrt{\epsilon} \sqrt{\mu} L2\omega^2 + 1 = 0$$

As a result, the signal stop frequency F will be expresses as follows.

$$F = \quad (9)$$

$$\frac{1}{2\pi} \sqrt{\frac{C1 + C2 \pm \sqrt{(C1+C2)^2 - 4C1C2Z1L1/(Z2L2)}}{2C1C2Z1L1 \sqrt{\epsilon} \sqrt{\mu}}}$$

As can be seen from the foregoing, there exist one or two stop frequencies F.

Figure 1:
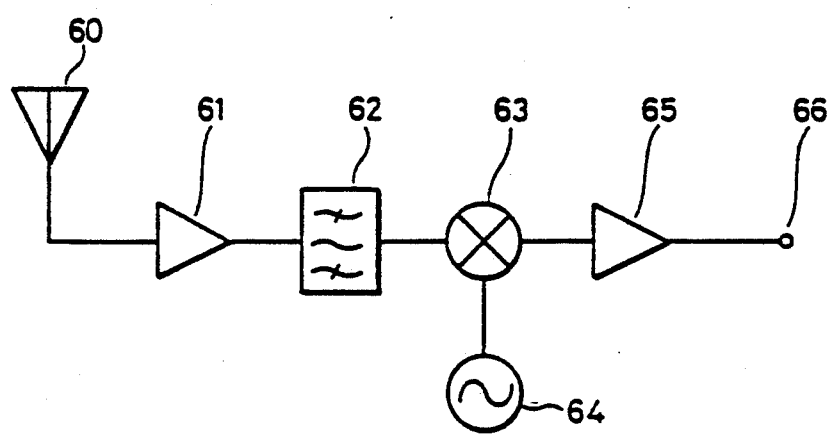
FIG. 1 is a schematic block diagram showing a structure of a BS converter in a conventional satellite broadcasting receiving apparatus.

When using the filter circuit according to the first embodiment shown in FIG. 5 as an image band (narrow band) stop filter 62 of the BS converter as shown in FIG. 1, it is desirable to approximate the two signal stop frequencies expressed by the above-described equation (9) to each other and increase the signal attenuation amount in the stop-band. That is, the respective parameters should be selected to satisfy the following equation.

$$(C1+C2)^2 \approx 4C1C2Z1L1/(Z2L2)$$

When using the filter circuit of FIG. 5 as a stop filter for a wide band, the two signal stop frequencies expressed by the equation (9) should be separated from each other.

Figure 6:
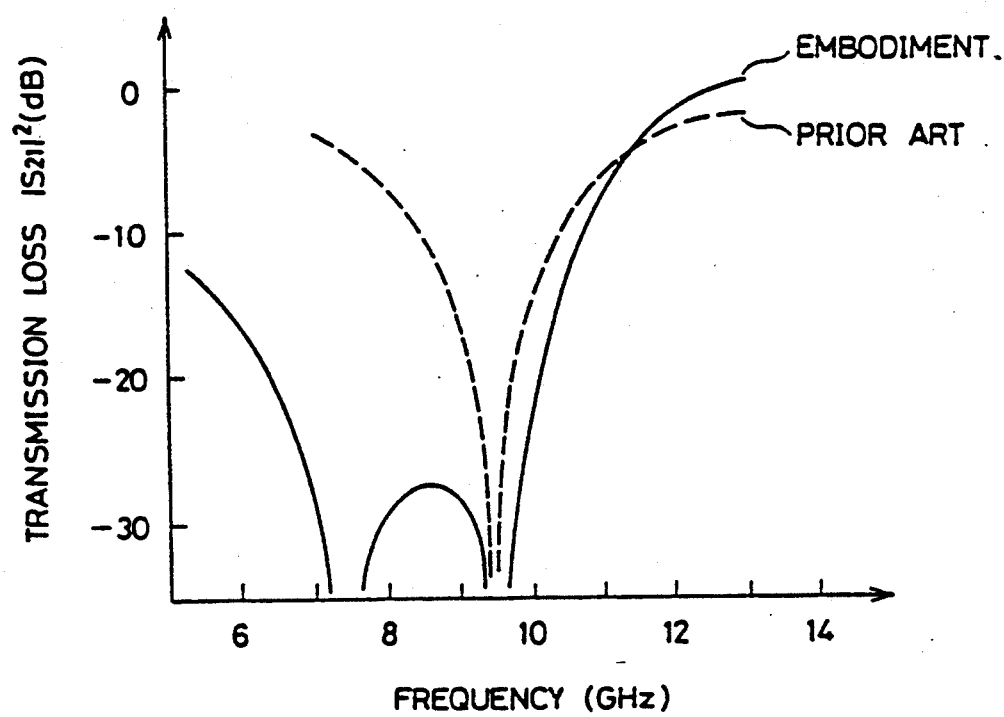
FIG. 6 is a graph showing a signal transmission characteristic of the filter circuit shown in FIG. 5.

FIG. 6 is a graph showing the calculation result of the filter characteristic of the filter circuit shown in FIG. 5 used as an image band stop filter for SHF band satellite broadcasting having a stop-band of 9.2 GHz–9.7 GHz and a pass band of 11.7 GHz–12.2 GHz.

Figure 2:
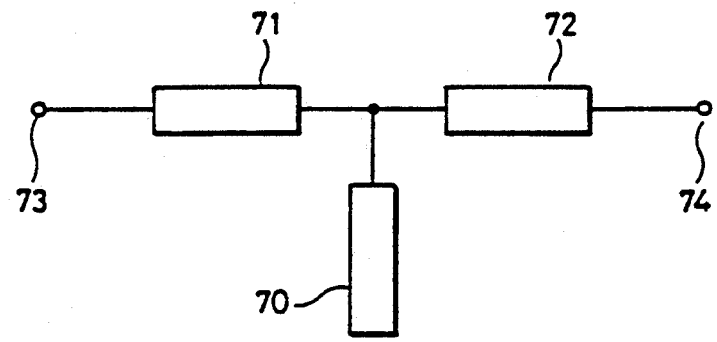
FIG. 2 is a circuit diagram showing an image band-stop filter circuit shown in FIG. 1.
Figure 3:
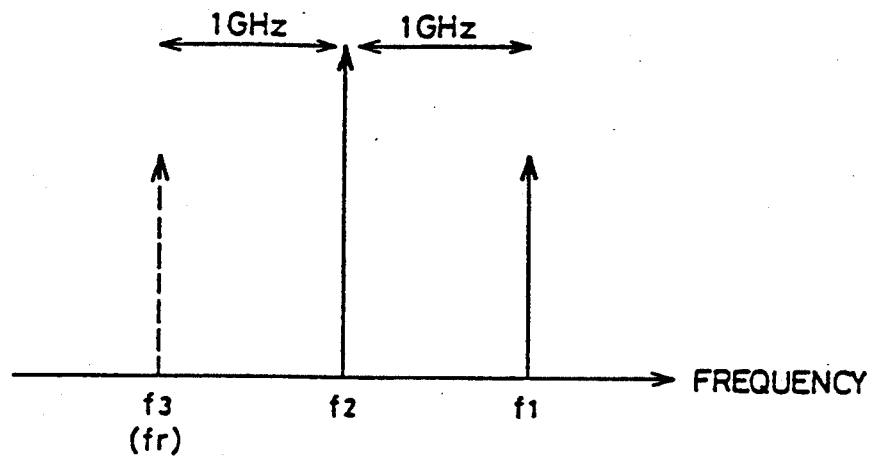
FIG. 3 is a frequency spectrum diagram for explaining an operation of the image band-stop filter circuit shown in FIG. 2.
Figure 4:
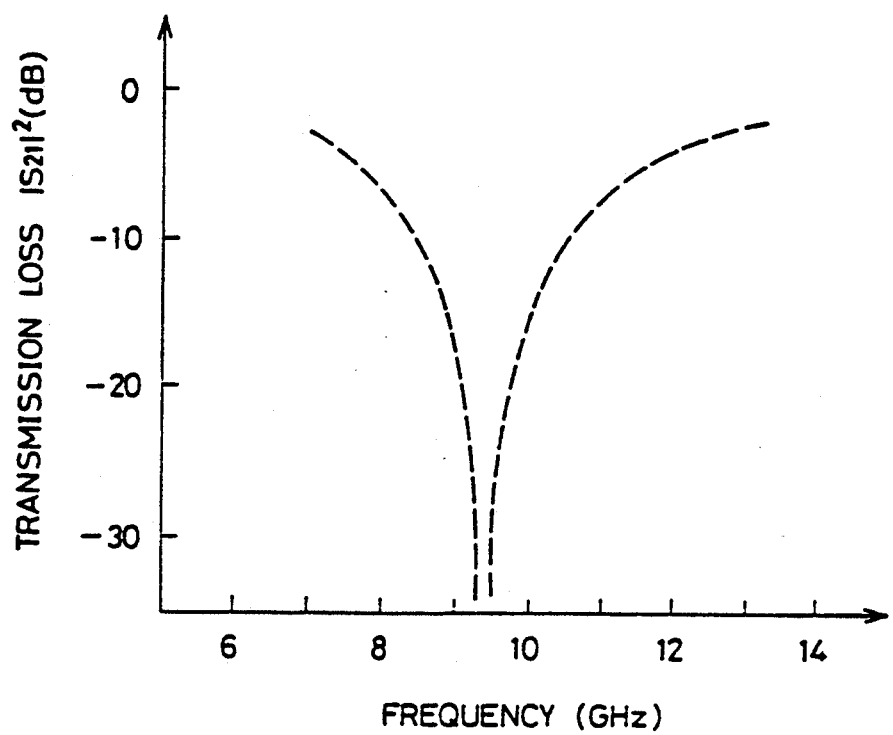
FIG. 4 is a graph showing a signal transmission characteristic of the band-stop filter circuit shown in FIG. 2.

That is, the solid line in FIG. 6 represents the signal transmission characteristic $|S_{21}|^2$ with Z1 of 50Ω, Z2 of 50Ω, C1 of 1.1 pF, C2 of 1.1 pF, L1 of 760 μm and L2 of 760 μm. In FIG. 6, the abscissa denotes a frequency of the signal (GHz), while the ordinate denotes a transmission loss (dB). The calculation result shown in FIG. 6 is obtained on the assumption that both of the input and output ports 5 and 6 are the terminals terminating at 50Ω. The broken line in FIG. 6 is provided for a comparison with a signal transmission characteristic of the conventional filter circuit (FIG. 2) shown in FIG. 4.

As is clear from the calculation result of FIG. 6, according to the characteristic of the filter circuit of the embodiment shown in FIG. 5, the signal attenuation amount in the signal stop-band is $-30$ dB or more which is larger than that of the prior art and a signal attenuation amount (transmission loss) in the signal pass band (11.7 GHz–12.2 GHz) is $-3$ dB or less which is smaller than that of the prior art. In other words, a more preferable signal transmission characteristic can be obtained by the filter circuit of FIG. 5 than that obtained by the conventional filter circuit (broken line). Furthermore, both of the transmission line 1 and the short stub 2 of the embodiment shown in FIG. 5 have a line length of 760 μm much shorter than the conventional parallel stub line length of 2.8 mm, which fact enables a filter circuit to be made into a MMIC.

As described in the foregoing, the first embodiment shown in FIG. 5 enables the area of the band-stop filter circuit to be reduced and to be made into MMIC with ease while obtaining an excellent filter characteristic, that is, obtaining an increased signal attenuation in a stop-band and a reduced transmission loss in a pass band.

As can be seen from the above-described equation (9), when designing a filter having the same signal stop frequency F, the line length L2 of the short stub 2 can be further reduced by setting the characteristic impedances of the transmission line 1 and the short stub 2 to be Z1+Z2 than by setting the characteristic impedances to be Z1=Z2. Description will be given in the following of a filter characteristic of the filter circuit according to the second embodiment shown in FIG. 5 wherein Z2 is set to be 80Ω.

Figure 7:
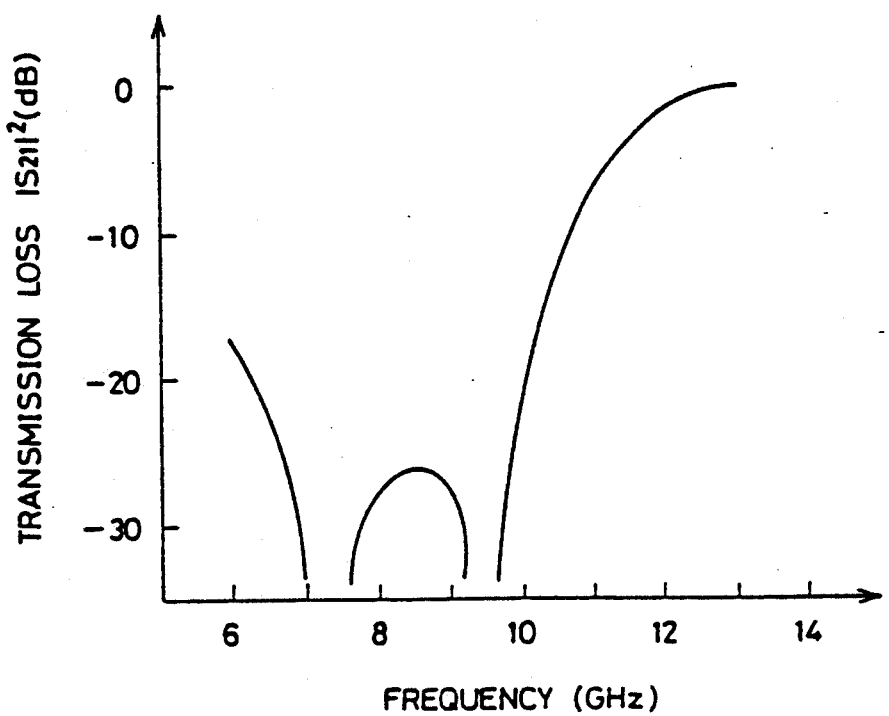
FIG. 7 is a graph showing a signal transmission characteristic of a band-stop filter circuit according to a second embodiment of the present invention.

That is, the calculation result of the filter characteristic is shown by the solid line in FIG. 7, which is obtained on the assumption that the characteristic impedance Z2 or the snort stub 2 is 80Ω and the line length L2 is 490 μm and the other parameters Z1, L1, C1 and C2 have the same values as those of the first embodiment. Comparing the filter characteristic of FIG. 7 with the filter characteristic of the first embodiment shown in FIG. 6, it can be seen that both of the frequency characteristics are substantially equal to each other.

That is, by setting the characteristic impedances Z1 and Z2 to be Z1<Z2, a filter characteristic substantially the same as that of the first embodiment can be obtained by using the stub 2 having a line length (L2=490 μm) shorter than the line length (L2=760 μm) of the first embodiment.

As a result, according to the second embodiment, setting the characteristic impedance Z1 of the transmission line 1 to be smaller than the characteristic impedance Z2 of the short stub 2 enables a filter circuit to be made smaller in scale while maintaining an excellent filter characteristic, thereby making the filter circuit into MMIC with more ease.

Figure 8:
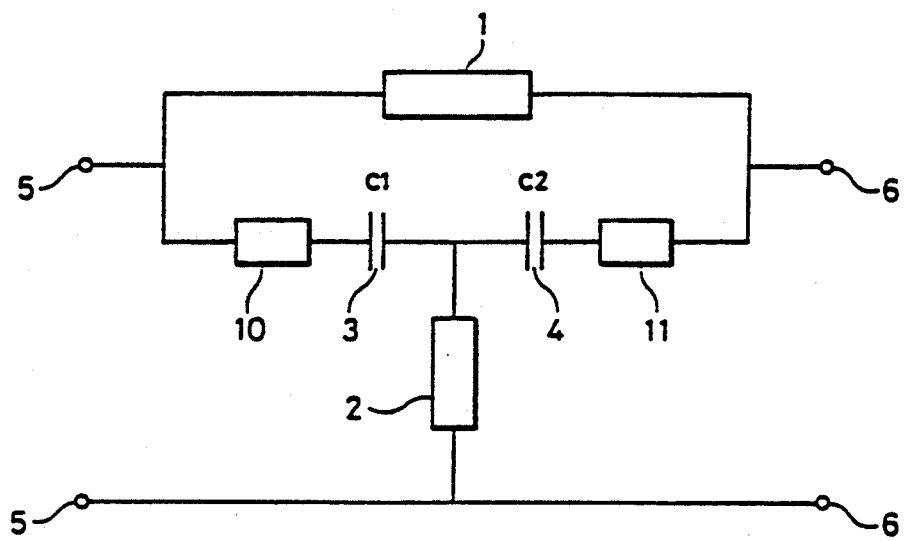
FIG. 8 is a circuit diagram showing a band-stop filter circuit according to a third embodiment of the present invention.

FIG. 8 is a circuit diagram showing a band-stop filter circuit according to a third embodiment of the present invention. The circuit shown in FIG. 8 is the same as that of the filter circuit according to the first embodiment shown in FIG. 5 except the following respects.

Additional transmission lines 10 and 11 are cascade-connected to the capacitances 3 and 4. Such structure enables a transmission loss to be further reduced in a signal pass band.

Figure 9:
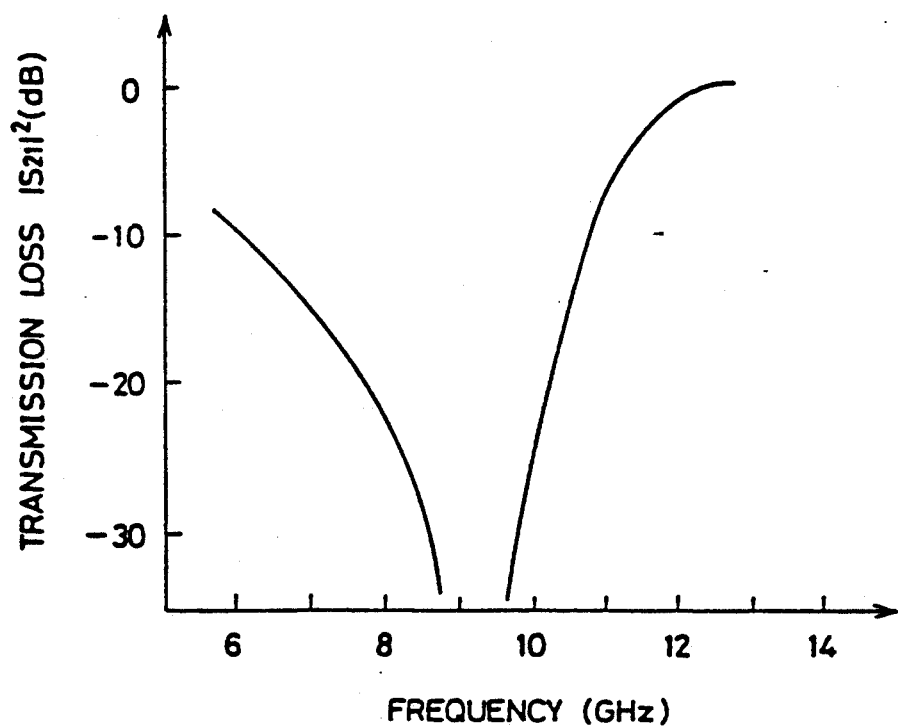
FIG. 9 is a graph showing a signal transmission characteristic of the filter circuit shown in FIG. 8.

The solid line of FIG. 9 shows the calculation result of the signal transmission characteristic according to the third embodiment of the present invention in a case where the characteristic impedances of the transmission lines 1, 10 and 11 and the short stub 2 are set to 50 $\Omega$, 50$\Omega$, 50$\Omega$ and 80$\Omega$, respectively, and the line length thereof to be 750 $\mu$m, 200 $\mu$m, 200 $\mu$m and 450$\mu$m, respectively, and both of the capacitance values C1 and C2 to be 0.72 pF.

As is clear from the calculation result of FIG. 9, according to the characteristic of the filter circuit of the third embodiment shown in FIG. 7, the signal attenuation amount in a signal stop-band (9.2 GHz–9.7 Ghz) is $-30$ dB or more as in the above-described first and second embodiments and a signal transmission loss in a signal pass band (11.7 GHz–12.2 GHz) is $-1.5$ dB or less which is smaller than those of the first and the second embodiments. The provision of the additional transmission lines 10 and 11 as in the third embodiment facilitates flexibility of the actual layout a formation of elements.

As described in the foregoing, the third embodiment of the present invention further improves the characteristic of the band-stop filter, in particular, a transmission loss in a signal pass band.

Although the description of the above-described respective embodiments are made in a case where GaAs is used for a substrate of the MMIC, the same effect can be obtained by using a semiconductor substrate of InP, for example. The above-described embodiments are applicable not only to MMIC but also to MIC using a dielectric substrate.

For a distributed constant circuit, a microstrip line, a coplanar line or the like can be used and there is no limit to a type of lines in particular. The present invention is therefore applicable to a distributed constant circuit combining a microstrip line and a coplanar line.

Furthermore, MIM (Metal Insulator Metal) capacitance and a Schottky capacitance can be used as the capacitances 3 and 4 of the embodiments of the present invention. Variations in a type of transmission line and capacitance do not affect the present invention.

As described in the foregoing, the present invention obtains a band-stop filter circuit having an excellent filter characteristic and suitably made into MMIC.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A band-stop filter circuit comprising:
   input and output terminals,
   a transmission line connecting said input and output terminals, and
   a T circuit connected in parallel to said transmission line, said T circuit including:
   series-connected first and second capacitance means connected in parallel to said transmission line, and
   a stub having one end connected to a node between said first and second capacitance means and the other end short-circuited,
   said stub having a line length which becomes inductive in an undesired signal band so as to filter out said undesired signal band.

2. The band-stop filter circuit according to claim 1, wherein said transmission line and said stub have characteristic impedances equal to each other.

3. The band-stop filter circuit according to claim 1, wherein the characteristic impedance of said stub is larger than that of said transmission line.

4. The band-stop filter circuit according to claim 1, wherein said transmission line and said T circuit are formed on a semiconductor substrate of GaAs material.

5. The band-stop filter circuit according to claim 1, wherein said transmission line and said T circuit are formed on a semiconductor substrate of InP material.

6. The band-stop filter circuit according to claim 1, wherein said transmission line and said T circuit are formed on a dielectric substrate.

7. The band-stop filter circuit according to claim 1, wherein said first and second capacitance means have capacitance values equal to each other.

8. A band-stop filter circuit comprising:
   input and output terminals,
   a first transmission line connecting said input and output terminals, and
   a T circuit connected in parallel to said first transmission line, said T circuit comprising;
   series-connected first and second capacitance means connected in parallel to said first transmission line,
   a second transmission line-connected in series between said input terminal and said first capacitance means,
   a third transmission line connected in series between said output terminal and said second capacitance means, and
   a stub having one end connected to a node between said first and second capacitance means and the other end short-circuited,
   said stub having a line length which becomes inductive in an undesired signal band so as to filter out said undesired signal band.

9. The band-stop filter circuit according to claim 8, wherein the characteristic impedance of said stub is larger than the characteristic impedances of said first, second and third transmission lines.

10. The band-stop filter circuit according to claim 8, wherein said transmission line and said T circuit are formed on a semiconductor substrate of GaAs material.

11. The band-stop filter circuit according to claim 8, wherein said transmission line and said T circuit are formed on a semiconductor substrate of InP material.

12. The band-stop filter circuit according to claim 8, wherein said transmission line and said T circuit are formed on a dielectric substrate.

13. The band-stop filter circuit according to claim 8, wherein said first and second capacitance means have capacitance values equal to each other.

* * * * *